US012662495B2

(12) United States Patent
Kim et al.

(10) Patent No.: US 12,662,495 B2
(45) Date of Patent: Jun. 23, 2026

(54) SILICON PRECURSOR COMPOUND, COMPOSITION FOR FORMING SILICON-CONTAINING FILM INCLUDING THE SAME, AND METHOD OF FORMING SILICON-CONTAINING FILM

(71) Applicant: UP CHEMICAL CO., LTD., Pyeongtaek-si (KR)

(72) Inventors: Jin Sik Kim, Pyeongtaek-si (KR); Byung Kwan Kim, Pyeongtaek-si (KR); Jun Hwan Choi, Goyang-si (KR); Da Som Yu, Pyeongtaek-si (KR)

(73) Assignee: UP CHEMICAL CO., LTD., Pyeongtaek-si (KR)

( * ) Notice: Subject to any disclaimer, the term of this patent is extended or adjusted under 35 U.S.C. 154(b) by 238 days.

(21) Appl. No.: 17/815,960

(22) Filed: Jul. 29, 2022

(65) Prior Publication Data

US 2022/0396592 A1 Dec. 15, 2022

Related U.S. Application Data

(63) Continuation of application No. PCT/KR2021/001084, filed on Jan. 27, 2021.

(30) Foreign Application Priority Data

Jan. 31, 2020 (KR) ........................ 10-2020-0011963

(51) Int. Cl.
*C07F 7/10* (2006.01)
*C23C 16/34* (2006.01)
*C23C 16/455* (2006.01)

(52) U.S. Cl.
CPC .............. *C07F 7/10* (2013.01); *C23C 16/345* (2013.01); *C23C 16/45553* (2013.01)

(58) Field of Classification Search
CPC .... C07F 7/10; C23C 16/345; C23C 16/45553
See application file for complete search history.

(56) References Cited

U.S. PATENT DOCUMENTS

| | | | | |
|---|---|---|---|---|
| 2011/0262642 | A1 | 10/2011 | Xiao | |
| 2012/0085733 | A1 | 4/2012 | Mebarki | |
| 2017/0125243 | A1 | 5/2017 | Jang | |
| 2017/0348681 | A1 | 12/2017 | Coperet | |
| 2018/0023192 | A1 | 1/2018 | Chandra et al. | |
| 2018/0105541 | A1 | 4/2018 | Wang et al. | |
| 2019/0040279 | A1 | 2/2019 | Khandelwal | |
| 2019/0085452 | A1 * | 3/2019 | Lei et al. | C23C 16/45553 |
| 2019/0088474 | A1 | 3/2019 | MacDonald | |

FOREIGN PATENT DOCUMENTS

| | | | | |
|---|---|---|---|---|
| CN | 101078109 | A | 11/2007 | |
| CN | 107429389 | A | 12/2017 | |
| CN | 109478497 | A | 3/2019 | |
| EP | 3307744 | A1 | 4/2018 | |
| EP | 3553204 | A2 | 10/2019 | |
| GB | 1473360 | A | 5/1977 | |
| JP | 2016-537305 | A | 12/2016 | |
| KR | 10-2012-0053454 | A | 5/2012 | |
| KR | 10-2014-0029136 | A | 3/2014 | |
| KR | 20140022136 | A * | 3/2014 | C07F 7/10 |
| KR | 10-2015-0142591 | A | 12/2015 | |
| KR | 10-2018-0010994 | A | 1/2018 | |
| KR | 10-2018-0027714 | A | 3/2018 | |
| KR | 10-2018-0118062 | A | 10/2018 | |
| KR | 10-2019-0059250 | A | 5/2019 | |
| KR | 10-2019-0093597 | A | 8/2019 | |
| KR | 10-2005940 | B1 | 8/2019 | |
| WO | WO2012067455 | A1 * | 5/2012 | C23C 16/30 |
| WO | 2015047914 | A1 | 4/2015 | |
| WO | 2016201314 | A1 | 12/2016 | |
| WO | 2018107138 | A1 | 6/2018 | |
| WO | 2019188103 | A1 | 10/2019 | |

OTHER PUBLICATIONS

WO2012067455A1 (Kim; machine translation) (Year: 2012).*
KR20140029136A (Lee et al.; machine translation) (Year: 2014).*
KR 2014 0029136 A (Lee et al. IDS reference—English language machine translation) (Year: 2014).*
WO 2012 067455 A1 (Kim et al. IDS reference—English language machine translation) (Year: 2012).*
International Search Report of PCT/KR2021/001084 dated Jun. 21, 2021.
Chemical Abstract Compound, STN express. RN: 2407719-80-4 (Jan. 22, 2020).

* cited by examiner

*Primary Examiner* — Amy C Bonaparte
*Assistant Examiner* — Derek Rhoades
(74) *Attorney, Agent, or Firm* — Shih IP Law Group, PLLC.

(57) ABSTRACT

The present disclosure relates to a silicon precursor compound, a method of preparing the silicon precursor compound, a silicon-containing film-forming precursor composition including the silicon precursor compound, and a method of forming a silicon-containing film using the precursor compound.

16 Claims, 4 Drawing Sheets

SILICON PRECURSOR COMPOUND, COMPOSITION FOR FORMING SILICON-CONTAINING FILM INCLUDING THE SAME, AND METHOD OF FORMING SILICON-CONTAINING FILM

CROSS-REFERENCE TO RELATED APPLICATIONS

This application is a continuation of PCT Application No. PCT/KR2021/001084, filed on Jan. 27, 2021, which claims priority to Korean Patent Application Number 10-2020-0011963, filed on Jan. 31, 2020, both of which are hereby incorporated by reference in their entirety.

TECHNICAL FIELD

The present disclosure relates to a silicon precursor compound, a method of preparing the silicon precursor compound, a silicon-containing film-forming precursor composition including the silicon precursor compound, and a method of forming a silicon-containing film using the precursor compound.

BACKGROUND

Silicon-containing films, such as silicon oxide, nitride, oxynitride and carbonitride films, are examples of the thin films which are essential for driving microelectronic devices, such as non-semiconductors (Logic), as well as semiconductors (DRAM, Flash Memory, ReRAM and PCRAM). Also, the silicon-containing films have been used in the display field, such as flat panel display field, solar cell field and organic light emitting diode (OLED) field including oxide thin film transistors (OTFTs). In a memory device, silicon-containing oxide thin films have been used for a dielectric film, a gate insulating film, a tunneling oxide film, a spacer oxide film, ILD & IMD and a passivation oxide film, and silicon-containing nitride thin films have been used for a diffusion mask, a gate spacer, a gate dielectric film, an etch stopper, a stressor and passivation. In the display field, silicon-containing oxide or nitride thin films have been used for various thin film layers such as a gate dielectric film, an interlayer dielectric film, an insulating film and a moisture barrier film. Particularly, in a process for manufacturing silicon-containing oxide thin films, such as double patterning (DPT), quadruple patterning (QPT) and gate sealing oxide film process for 3D NAND requiring ultra-low temperatures depending on the applied field, various silicon-containing oxide films, such as a gate oxide film formed at a high temperature or a slit oxide film of a 3D NAND, are required depending on various process conditions. Various precursors have been be used as a silicon precursor used in each process depending on physical and chemical properties.

When a silicon-containing film is formed by an atomic layer deposition (ALD) method for sequentially supplying a silicon compound gas and a reaction gas necessary for film formation, a silicon-containing film of uniform thickness can be formed even on a rough surface. A silicon-containing film can be formed even at low temperatures by an ALD method using plasma. If a silicon precursor compound with a fast film growth per gas supply cycle (film growth rate, growth-per-cycle (GPC)) is used in the ALD method, an ALD device can process more semiconductors or display substrates per unit time. Therefore, it is possible to minimize the number of required ALD devices.

Prior Art Document

U.S. Patent Laid-open Publication No. 2012/0085733.

DISCLOSURE OF THE INVENTION

Problems to be Solved by the Invention

The present disclosure provides a silicon precursor compound, a method of preparing the silicon precursor compound, a silicon-containing film-forming precursor composition including the silicon precursor compound, and a method of forming a silicon-containing film using the precursor compound.

In particular, the present disclosure provides a method for forming a silicon-containing film with a fast film growth per gas supply cycle in an atomic layer deposition method for sequentially supplying a raw material and a reaction gas. Also, the present disclosure provides a novel silicon compound advantageous for use in a method of forming a silicon-containing film according to embodiments of the present disclosure, a method of preparing the same, and a precursor composition including the novel silicon compound.

However, problems to be solved by the present disclosure are not limited to the above-described problems. Although not described herein, other problems to be solved by the present disclosure can be clearly understood by a person with ordinary skill in the art from the following description.

Means for Solving the Problems

A first aspect of the present disclosure provides a silicon precursor compound, represented by the following Chemical Formula I:

$$R^1R^2N—SiH_2—N(SiR^3R^4R^5)_2; \quad \text{[Chemical Formula I]}$$

wherein, in the above Chemical Formula I, each of $R^1$ and $R^2$ independently includes a linear or branched $C_1$-$C_4$ alkyl group or a substituted or unsubstituted $C_4$-$C_8$ cyclic alkyl group linked to each other, if $R^1$ and $R^2$ are cyclic alkyl groups, $—NR^1R^2$ includes a cyclic amino group having at least one nitrogen atom, and each of $R^3$, $R^4$ and $R^5$ independently includes hydrogen, a linear or branched $C_1$-$C_4$ alkyl group or a linear or branched alkenyl group, provided that $R^3$, $R^4$ and $R^5$ are not hydrogen at the same time.

A second aspect of the present disclosure provides a method of preparing a silicon precursor compound represented by the following Chemical Formula I, including: (a) obtaining $XSiH_2N(SiR^3R^4R^5)_2$ through a halide-amine substitution reaction selected from the following Reaction Formula 1-1, Reaction Formula 1-2 or Reaction Formula 1-3; and (b) obtaining a silicon precursor compound represented by the following Chemical Formula I through a halide-amine substitution reaction selected from the following Reaction Formula 2-1, Reaction Formula 2-2 or Reaction Formula 2-3 of $XSiH_2N(SiR^3R^4R^5)_2$:

$$H_2SiX_2+M^1\text{-}N(SiR^3R^4R^5)_2 \rightarrow XSiH_2N(SiR^3R^4R^5)_2+M^1X; \quad \text{[Formula 1-1]}$$

$$H_2SiX_2+2HN(SiR^3R^4R^5)_2 \rightarrow XSiH_2N(SiR^3R^4R^5)_2+HX—HN(SiR^3R^4R^5)_2; \quad \text{[Formula 1-2]}$$

$H_2SiX_2+HN(SiR^3R^4R^5)_2+NEt_3 \rightarrow XSiH_2N(SiR^3R^4R^5)_2+HX—NEt_3$; [Formula 1-3]

$XSiH_2N(SiR^3R^4R^5)_2+M^2\text{-}NR^1R^2 \rightarrow R^1R^2NSiH_2N(SiR^3R^4R^5)_2+M^2X$; [Formula 2-1]

$XSiH_2N(SiR^3R^4R^5)_2+2HNR^1R^2 \rightarrow R^1R^2NSiH_2N(SiR^3R^4R^5)_2+HX—HNR^1R^2$; [Formula 2-2]

$XSiH_2N(SiR^3R^4R^5)_2+HNR^1R^2+NEt_3 \rightarrow R^1R^2NSiH_2N(SiR^3R^4R^5)_2+HX—NEt_3$; [Formula 2-3]

$R^1R^2N—SiH_2—N(SiR^3R^4R^5)_2$; [Chemical Formula I]

wherein, in the Reaction Formulas 1-1 to 1-3, the Reaction Formulas 2-1 to 2-3, and the Chemical Formula I, each of $M^1$ and $M^2$ is independently Li, Na or K, X is a halogen element, each of $R^1$ and $R^2$ independently includes a linear or branched $C_1$-$C_4$ alkyl group or a substituted or unsubstituted $C_4$-$C_8$ cyclic alkyl group linked to each other, if $R^1$ and $R^2$ are cyclic alkyl groups, —$NR^1R^2$ includes a cyclic amino group having at least one nitrogen atom(s), and each of $R^3$, $R^4$ and $R^5$ independently includes hydrogen, a linear or branched $C_1$-$C_4$ alkyl group or a linear or branched alkenyl group, provided that $R^3$, $R^4$ and $R^5$ are not hydrogen at the same time.

A third aspect of the present disclosure provides a silicon-containing film-forming precursor composition, including a silicon precursor compound according to the first aspect.

A fourth aspect of the present disclosure provides a method of forming a silicon-containing film, including forming a silicon-containing film using a film-forming precursor composition including a silicon precursor compound according to the first aspect.

Effects of the Invention

A silicon-containing film may be formed using a silicon precursor compound according to embodiments of the present disclosure. In particular, a silicon oxide film can be grown much faster in a plasma atomic layer deposition method using an oxygen ($O_2$) gas, as compared to the case of using a conventionally known silicon compound. If a silicon precursor compound with a fast film growth per gas supply cycle is used in the ALD method, an ALD device can process more semiconductors or display substrates per unit time. Therefore, it is possible to minimize the number of required ALD devices.

In a method of depositing a thin film using a silicon precursor compound according to the present disclosure, a silicon-containing oxide thin film or a silicon-containing nitride thin film is deposited on a substrate by an ALD method using a silicon precursor compound. If a silicon-containing oxide thin film or a silicon-containing nitride thin film is deposited by the ALD method as described above, it is possible to lower the process temperature during deposition and accurately control the thickness and composition of the thin film. Therefore, it is possible to deposit a thin film with excellent coverage even on a substrate having a complicated shape and improve the thickness uniformity and physical properties of the thin film.

The method of depositing a thin film using a silicon precursor compound according to the present disclosure can be used in manufacturing of memory devices, logic devices, display devices and OLEDs.

BEST MODE FOR CARRYING OUT THE INVENTION

Figure 1A:
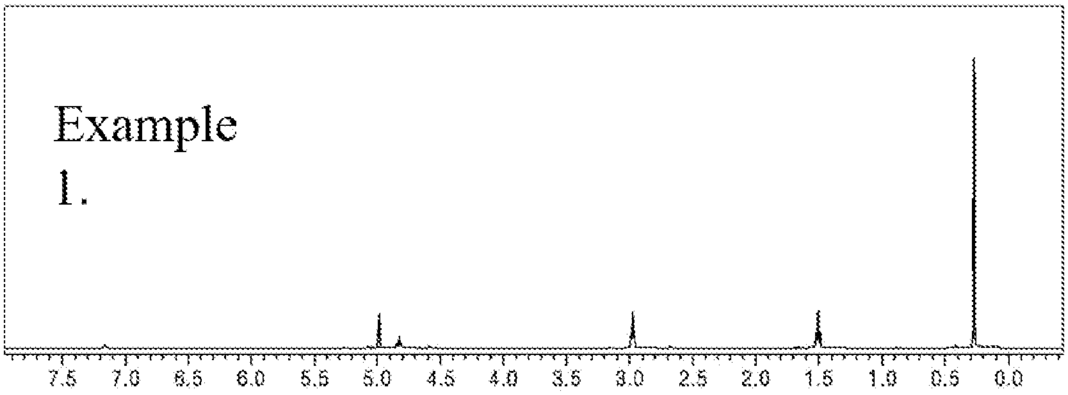
FIG. 1A shows $^1$H-NMR spectra of silicon-containing compounds prepared according to Example 1 and FIG. 1B shows $^1$H-NMR spectra of silicon-containing compounds prepared according to Example 2 of the present disclosure.

Hereinafter, embodiments and examples of the present disclosure will be described in detail with reference to the accompanying drawings so that the present disclosure may be readily implemented by those skilled in the art. However, it is to be noted that the present disclosure is not limited to the examples but can be embodied in various other ways. In drawings, parts irrelevant to the description are omitted for the simplicity of explanation, and like reference numerals denote like parts through the whole document.

Through the whole document, the term "connected to" or "coupled to" that is used to designate a connection or coupling of one element to another element includes both a case that an element is "directly connected or coupled to" another element and a case that an element is "electronically connected or coupled to" another element via still another element.

Through the whole document, the term "on" that is used to designate a position of one element with respect to another element includes both a case that the one element is adjacent to the other element and a case that any other element exists between these two elements.

Through the whole document, the term "comprises or includes" and/or "comprising or including" used in the document means that one or more other components, steps, operation and/or existence or addition of elements are not excluded in addition to the described components, steps, operation and/or elements unless context dictates otherwise.

Through the whole document, the term "about or approximately" or "substantially" is intended to have meanings close to numerical values or ranges specified with an allowable error and intended to prevent accurate or absolute numerical values disclosed for understanding of the present disclosure from being illegally or unfairly used by any unconscionable third party.

Through the whole document, the term "step of" does not mean "step for".

Through the whole document, the term "combination of" included in Markush type description means mixture or combination of one or more components, steps, operations and/or elements selected from a group consisting of components, steps, operation and/or elements described in Markush type and thereby means that the disclosure includes one or more components, steps, operations and/or elements selected from the Markush group.

Through this whole specification, a phrase in the form "A and/or B" means "A or B, or A and B".

Through the whole document, the term "alkyl" or "alkyl group" includes a linear or branched alkyl group having 1 to 12 carbon atoms, 1 to 10 carbon atoms, 1 to 8 carbon atoms, or 1 to 5 carbon atoms and all the possible isomers thereof. For example, the alkyl or alkyl group may include a methyl group (Me), an ethyl group (Et), a n-propyl group ($^{n}$Pr), an iso-propyl group ($^{i}$Pr), a n-butyl group ($^{n}$Bu), an iso-butyl group ($^{i}$Bu), a tert-butyl group ($^{t}$Bu), a sec-butyl group ($^{sec}$Bu), a n-pentyl group ($^{n}$Pe), an iso-pentyl group ($^{iso}$Pe), a sec-pentyl group ($^{sec}$Pe), a tert-pentyl group ($^{t}$Pe), a neo-pentyl group ($^{neo}$Pe), a 3-pentyl group, a n-hexyl group, an iso-hexyl group, a heptyl group, a 4,4-dimethyl pentyl group, an octyl group, a 2,2,4-trimethyl pentyl group, a nonyl group, a decyl group, an undecyl group, a dodecyl group, and isomers thereof, but may not be limited thereto.

Through the whole document, the term "film" means "a film or thin film".

Hereinafter, embodiments of the present disclosure have been described in detail, but the present disclosure may not be limited thereto.

A first aspect of the present disclosure provides a silicon precursor compound, represented by the following Chemical Formula I:

$R^1R^2N—SiH_2—N(SiR^3R^4R^5)_2$; [Chemical Formula I]

wherein, in the above Chemical Formula I, each of $R^1$ and $R^2$ independently includes a linear or branched $C_1$-$C_4$ alkyl group or a substituted or unsubstituted $C_4$-$C_8$ cyclic alkyl group linked to each other, if $R^1$ and $R^2$ are cyclic alkyl groups, —$NR^1R^2$ includes a cyclic amino group having at least one nitrogen atom(s), and each of $R^3$, $R^4$ and $R^5$ independently includes hydrogen, a linear or branched $C_1$-$C_4$ alkyl group or a linear or branched alkenyl group, provided that $R^3$, $R^4$ and $R^5$ are not hydrogen at the same time.

In an embodiment of the present disclosure, each of $R^1$ and $R^2$ may independently include methyl group, ethyl group, n-propyl group, iso-propyl group, n-butyl group, iso-butyl group, sec-butyl group, tert-butyl group, or a substituted or unsubstituted $C_4$-$C_8$ cyclic alkyl group linked to each other, but may not be limited thereto.

In an embodiment of the present disclosure, —$NR^1R^2$ may include dimethylamino group ($Me_2N$—), ethylmethylamino group (EtMeN—), diethylamino group ($Et_2N$—), pyrrolidine group, piperidine group, 2,6-dimethylpiperidine group, 4-methylpiperazine group, or morpholine group, but may not be limited thereto.

In an embodiment of the present disclosure, each of $R^3$, $R^4$ and $R^5$ may be independently hydrogen, methyl group, ethyl group, n-propyl group, iso-propyl group, n-butyl group, iso-butyl group, sec-butyl group or tert-butyl group, but may not be limited thereto.

In an embodiment of the present disclosure, —$SiR^3R^4R^5$ includes —$SiHMe_2$, —SiHMeEt, —SiHMe($^{n}$Pr), —SiHMe($^{iso}$Pr), —$SiHEt_2$, —SiHEt($^{n}$Pr), —SiHEt($^{iso}$Pr), —$SiH(^{n}Pr)_2$, —SiH($^{n}$Pr)($^{iso}$Pr) or —$SiH(^{iso}Pr)_2$, but may not be limited thereto. In an embodiment of the present disclosure, —$SiR^3R^4R^5$ may be —$SiHMe_2$.

In an embodiment of the present disclosure, the silicon precursor compound may be represented by the following Chemical Formula 1:

$R^1R^2N—SiH_2—N(SiR^3R^4R^5)_2$; [Chemical Formula 1]

wherein, in the above Chemical Formula 1, each of $R^1$ and $R^2$ is a substituted or unsubstituted $C_4$-$C_8$ cyclic alkyl group linked to each other, and —$NR^1R^2$ includes a cyclic amino group having at least one nitrogen atom(s); and each of $R^3$, $R^4$ and $R^5$ independently includes hydrogen, a linear or branched $C_1$-$C_4$ alkyl group or a linear or branched alkenyl group, provided that $R^3$, $R^4$ and $R^5$ are not hydrogen at the same time.

In an embodiment of the present disclosure, —$NR^1R^2$ includes pyrrolidine group, piperidine group, 2,6-dimethylpiperidine group, 4-methylpiperazine group or morpholine group.

In an embodiment of the present disclosure, each of $R^3$, $R^4$ and $R^5$ may be independently hydrogen, methyl group, ethyl group, n-propyl group, iso-propyl group, n-butyl group, iso-butyl group, sec-butyl group or tert-butyl group, but may not be limited thereto.

In an embodiment of the present disclosure, —$SiR^3R^4R^5$ includes —$SiHMe_2$, —SiHMeEt, —SiHMe($^{n}$Pr), —SiHMe($^{iso}$Pr), —$SiHEt_2$, —SiHEt($^{n}$Pr), —SiHEt($^{iso}$Pr), —$SiH(^{n}Pr)_2$, —SiH($^{n}$Pr)($^{iso}$Pr) or —$SiH(^{iso}Pr)_2$ but may not be limited thereto. In an embodiment of the present disclosure, —$SiR^3R^4R^5$ may be —$SiHMe_2$.

In an embodiment of the present disclosure, a silicon precursor compound may be represented by the following Chemical Formula 2:

$R^1R^2N—SiH_2—N(SiR^3R^4R^5)_2$; [Chemical Formula 2]

wherein, in the above Chemical Formula 2, each of $R^1$ and $R^2$ independently includes a linear or branched $C_1$-$C_4$ alkyl group; and each of $R^3$, $R^4$ and $R^5$ independently includes hydrogen, a linear or branched $C_1$-$C_4$ alkyl group or a linear or branched alkenyl group, provided that $R^3$, $R^4$ and $R^5$ are not hydrogen at the same time.

In an embodiment of the present disclosure, each of $R^3$, $R^4$ and $R^5$ may be independently hydrogen, methyl group, ethyl group, n-propyl group, iso-propyl group, n-butyl group, iso-butyl group, sec-butyl group or tert-butyl group, but may not be limited thereto.

In an embodiment of the present disclosure, —$SiR^3R^4R^5$ includes —$SiHMe_2$, —SiHMeEt, —SiHMe($^{n}$Pr), —SiHMe($^{iso}$Pr), —$SiHEt_2$, —SiHEt($^{n}$Pr), —SiHEt($^{iso}$Pr), —$SiH(^{n}Pr)_2$, —SiH($^{n}$Pr)($^{iso}$Pr) or —$SiH(^{iso}Pr)_2$, but may not be limited thereto. In an embodiment of the present disclosure, —$SiR^3R^4R^5$ may be —$SiHMe_2$.

In an embodiment of the present disclosure, the silicon precursor compound may include the following compounds:

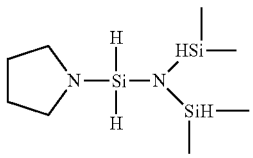

,

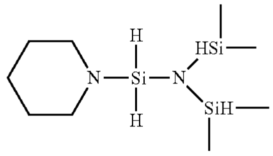

,

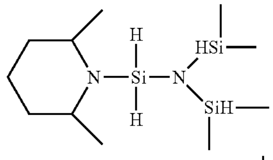

,

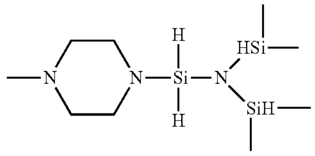

,

-continued

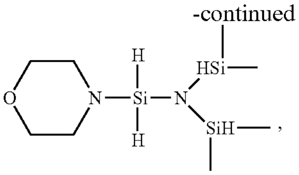
,

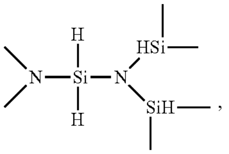
, or

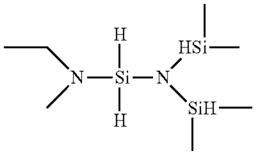
.

A second aspect of the present disclosure provides a method of preparing a silicon precursor compound represented by the following Chemical Formula I, including: (a) obtaining $XSiH_2N(SiR^3R^4R^5)_2$ through a halide-amine substitution reaction selected from the following Reaction Formula 1-1, Reaction Formula 1-2 or Reaction Formula 1-3; and (b) obtaining a silicon precursor compound represented by the following Chemical Formula I through a halide-amine substitution reaction selected from the following Reaction Formula 2-1, Reaction Formula 2-2 or Reaction Formula 2-3 of $XSiH_2N(SiR^3R^4R^5)_2$:

$H_2SiX_2+M^1\text{-}N(SiR^3R^4R^5)_2 \rightarrow XSiH_2N(SiR^3R^4R^5)_2+M^1X$; [Formula 1-1]

$H_2SiX_2+2HN(SiR^3R^4R^5)_2 \rightarrow XSiH_2N(SiR^3R^4R^5)_2+HX\text{—}HN(SiR^3R^4R^5)_2$; [Formula 1-2]

$H_2SiX_2+HN(SiR^3R^4R^5)_2+NEt_3 \rightarrow XSiH_2N(SiR^3R^4R^5)_2+HX\text{—}NEt_3$; [Formula 1-3]

$XSiH_2N(SiR^3R^4R^5)_2+M^2\text{-}NR^1R^2 \rightarrow R^1R^2NSiH_2N(SiR^3R^4R^5)_2+M^2X$; [Formula 2-1]

$XSiH_2N(SiR^3R^4R^5)_{2+2}HNR^1R^2 \rightarrow R^1R^2NSiH_2N(SiR^3R^4R^5)_2+HX\text{—}HNR^1R^2$; [Formula 2-2]

$XSiH_2N(SiR^3R^4R^5)_2+HNR^1R^2+NEt_3 \rightarrow R^1R^2NSiH_2N(SiR^3R^4R^5)_2+HX\text{—}NEt_3$; [Formula 2-3]

$R^1R^2N\text{—}SiH_2\text{—}N(SiR^3R^4R^5)_2$; [Chemical Formula I]

wherein, in the Reaction Formulas 1-1 to 1-3, the Reaction Formulas 2-1 to 2-3, and the Chemical Formula I, each of $M^1$ and $M^2$ is independently Li, Na or K, X is a halogen element, each of $R^1$ and $R^2$ independently includes a linear or branched $C_1$-$C_4$ alkyl group; or a substituted or unsubstituted $C_4$-$C_8$ cyclic alkyl group linked to each other, if $R^1$ and $R^2$ are cyclic alkyl groups, $\text{—}NR^1R^2$ includes a cyclic amino group having at least one nitrogen atom(s), and each of $R^3$, $R^4$ and $R^5$ independently includes hydrogen, a linear or branched $C_1$-$C_4$ alkyl group or a linear or branched alkenyl group, provided that $R^3$, $R^4$ and $R^5$ are not hydrogen at the same time.

Detailed descriptions of the second aspect of the present disclosure, which overlap with those of the first aspect of the present disclosure, are omitted hereinafter, but the descriptions of the first aspect of the present disclosure may be identically applied to the second aspect of the present disclosure, even though they are omitted hereinafter.

In an embodiment of the present disclosure, each of $R^1$ and $R^2$ may independently include methyl group, ethyl group, n-propyl group, iso-propyl group, n-butyl group, iso-butyl group, sec-butyl group, tert-butyl group, or a substituted or unsubstituted $C_4$-$C_8$ cyclic alkyl group linked to each other, but may not be limited thereto. In an embodiment of the present disclosure, $R^1$ and $R^2$ may include a substituted or unsubstituted $C_4$-$C_8$ cyclic alkyl group linked to each other.

In an embodiment of the present disclosure, $\text{—}NR^1R^2$ may include dimethylamino group ($Me_2N\text{—}$), ethylmethylamino group ($EtMeN\text{—}$), diethylamino group ($Et_2N\text{—}$), pyrrolidine group, piperidine group, 2,6-dimethylpiperidine group, 4-methylpiperazine group, or morpholine group, but may not be limited thereto. In an embodiment of the present disclosure, $\text{—}NR^1R^2$ may include pyrrolidine group, piperidine group, 2,6-dimethylpiperidine group, 4-methylpiperazine group, or morpholine group.

In an embodiment of the present disclosure, $\text{—}SiR^3R^4R^5$ includes $\text{—}SiHMe_2$, $\text{—}SiHMeEt$, $\text{—}SiHMe(^nPr)$, $\text{—}SiHMe(^{iso}Pr)$, $\text{—}SiHEt_2$, $\text{—}SiHEt(^nPr)$, $\text{—}SiHEt(^{iso}Pr)$, $\text{—}SiH(^nPr)_2$, $\text{—}SiH(^nPr)(^{iso}Pr)$ or $\text{—}SiH(^{iso}Pr)_2$, but may not be limited thereto. In an embodiment of the present disclosure, $\text{—}SiR^3R^4R^5$ may be $\text{—}SiHMe_2$.

In an embodiment of the present disclosure, the silicon precursor compound may include the following compounds:

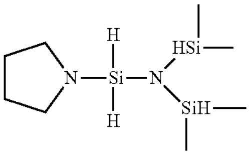
,

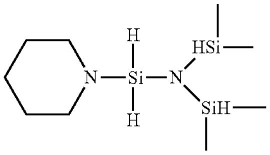
,

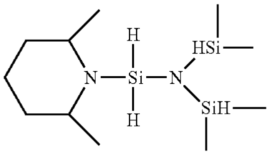
,

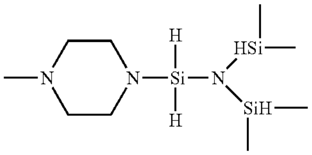
,

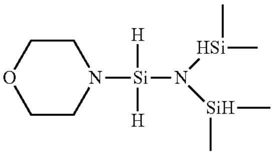
,

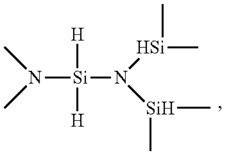
, or

-continued

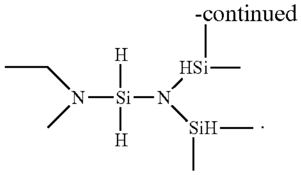

In an embodiment of the present disclosure, the silicon precursor compound represented by the above Chemical Formula I may be synthesized by adding about 1 equivalent of a metallic silylamine salt ($M^1$-$N(SiR^3R^4R^5)$, $M^1$: Li, Na, or K) to dichlorosilane ($H_2SiCl_2$) at a low temperature, making a substitution reaction between halide and amine while maintaining room temperature, and removing a reaction by-product in the form of a metallic halide salt through a filter in a primary reaction when X is Cl, as shown in the Reaction Formula 1-1, and adding about 1 equivalent of a metallic amine salt ($M^2$-$NR^1R^2$, M: Li, Na, or K) at a low temperature, making a substitution reaction between halide and amine while maintaining room temperature, and removing a reaction by-product in the form of a metallic halide salt through a filter in a secondary reaction, as shown in the Reaction Formula 2-1. However, the present disclosure may not be limited thereto.

In an embodiment of the present disclosure, an excess of amine may be used or a tertiary amine such as triethylamine ($NEt_3$) may be used instead of an alkali metal salt of an amino group. Specifically, the silicon precursor compound may be prepared according to the Reaction Formula 1-2 or Reaction Formula 1-3 instead of the Reaction Formula 1-1, and the silicon precursor compound may be prepared according to the Reaction Formula 2-2 or Reaction Formula 2-3 instead of the Reaction Formula 2-1. However, the present disclosure may not be limited thereto.

In an embodiment of the present disclosure, nonpolar alkanes having 5 to 8 carbon atoms, such as pentane, hexane, octane, etc., or toluene with weak polarity may be used as a solvent used in the reaction in the process (a). Desirably, hexane may be used because it is stable with a boiling point of 78° C.

In an embodiment of the present disclosure, the compound represented by the following Chemical Formula 4 is a silicon precursor (tetramethyldisilyl)aminopiperidinylsilane prepared by making a substitution reaction between Cl and amine through a reaction between dichlorosilane ($SiH_2Cl_2$) and lithium(tetramethyldisilyl)amine salt at a low temperature in a hexane solvent, which is a non-polar solvent, in a primary reaction, and then making a substitution reaction between another Cl and amine through a reaction with lithium piperidine salt at a low temperature, followed by filtration and vacuum distillation in a secondary reaction as shown in the following Reaction Formula A. Lithium (tetramethyldisilyl)amine salt and lithium piperidine salt are prepared by reacting n-BuLi with tetramethyldisilazane and n-BuLi with piperidine, respectively, in hexane, which is a nonpolar solvent, at a low temperature. Desirably, the reaction is carried out under an atmosphere of nitrogen ($N_2$) or argon (Ar) to safely remove a salt ((LiCl) and unreacted $SiH_2Cl_2$, which are products of the primary and secondary reactions as shown in Reaction Formula A, and to suppress decomposition caused by moisture or oxygen during the reaction. However, the present disclosure may not be limited thereto:

[Chemical Formula 4]

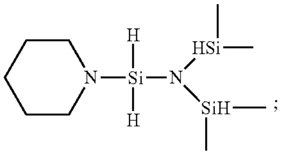

[Reaction Formula A]Primary reaction

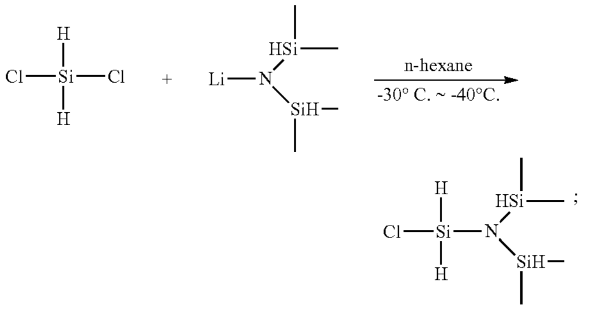

Secondary reaction

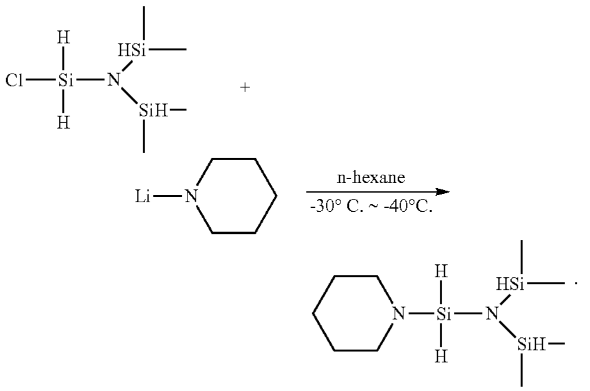

A third aspect of the present disclosure provides a silicon-containing film-forming precursor composition, including a silicon precursor compound according to the first aspect.

Detailed descriptions of the third aspect of the present disclosure, which overlap with those of the first aspect and the second aspect of the present disclosure, are omitted hereinafter, but the descriptions of the first aspect and the second aspect of the present disclosure may be identically applied to the third aspect of the present disclosure, even though they are omitted hereinafter.

In an embodiment of the present disclosure, the silicon precursor compound may be represented by the following Chemical Formula I:

$R^1R^2N—SiH_2—N(SiR^3R^4R^5)_2$; [Chemical Formula I]

wherein, in the above Chemical Formula I, each of $R^1$ and $R^2$ independently includes a linear or branched $C_1$-$C_4$ alkyl group or a substituted or unsubstituted $C_4$-$C_8$ cyclic alkyl group linked to each other, if $R^1$ and $R^2$ are cyclic alkyl groups, —$NR^1R^2$ includes a cyclic amino group having at least one nitrogen atom(s); and each of $R^3$, $R^4$ and $R^5$ independently includes hydrogen, a linear or branched $C_1$-$C_4$ alkyl group or a linear or branched alkenyl group, provided that $R^3$, $R^4$ and $R^5$ are not hydrogen at the same time.

In an embodiment of the present disclosure, each of $R^1$ and $R^2$ may independently include methyl group, ethyl group, n-propyl group, iso-propyl group, n-butyl group, iso-butyl group, sec-butyl group, tert-butyl group, or a substituted or unsubstituted $C_4$-$C_8$ cyclic alkyl group linked to each other, but may not be limited thereto.

In an embodiment of the present disclosure, —$NR^1R^2$ may include dimethylamino group ($Me_2N$—), ethylmethylamino group (EtMeN—), diethylamino group ($Et_2N$—), pyrrolidine group, piperidine group, 2,6-dimethylpiperidine group, 4-methylpiperazine group, or morpholine group, but may not be limited thereto.

In an embodiment of the present disclosure, each of $R^3$, $R^4$ and $R^5$ may be independently hydrogen, methyl group, ethyl group, n-propyl group, iso-propyl group, n-butyl group, iso-butyl group, sec-butyl group or tert-butyl group, but may not be limited thereto.

In an embodiment of the present disclosure, —$SiR^3R^4R^5$ includes —$SiHMe_2$, —SiHMeEt, —SiHMe($^{n}$Pr), —SiHMe($^{iso}$Pr), —$SiHEt_2$, —SiHEt($^{n}$Pr), —SiHEt($^{iso}$Pr), —SiH($^{n}$Pr)$_2$, —SiH($^{n}$Pr)($^{iso}$Pr) or —SiH($^{iso}$Pr)$_2$, but may not be limited thereto. In an embodiment of the present disclosure, —$SiR^3R^4R^5$ may be —$SiHMe_2$.

In an embodiment of the present disclosure, the silicon precursor compound may be represented by the following Chemical Formula 1:

$R^1R^2N$—$SiH_2$—$N(SiR^3R^4R^5)_2$; [Chemical Formula 1]

wherein, in the above Chemical Formula 1, each of $R^1$ and $R^2$ is a substituted or unsubstituted $C_4$-$C_8$ cyclic alkyl group linked to each other, and —$NR^1R^2$ includes a cyclic amino group having at least one nitrogen atom(s); and each of $R^3$, $R^4$ and $R^5$ independently includes hydrogen, a linear or branched $C_1$-$C_4$ alkyl group or a linear or branched alkenyl group, provided that $R^3$, $R^4$ and $R^5$ are not hydrogen at the same time.

In an embodiment of the present disclosure, —$NR^1R^2$ includes pyrrolidine group, piperidine group, 2,6-dimethylpiperidine group, 4-methylpiperazine group or morpholine group.

In an embodiment of the present disclosure, each of $R^3$, $R^4$ and $R^5$ may be independently hydrogen, methyl group, ethyl group, n-propyl group, iso-propyl group, n-butyl group, iso-butyl group, sec-butyl group or tert-butyl group, but may not be limited thereto.

In an embodiment of the present disclosure, —$SiR^3R^4R^5$ includes —$SiHMe_2$, —SiHMeEt, —SiHMe($^{n}$Pr), —SiHMe($^{iso}$Pr), —$SiHEt_2$, —SiHEt($^{n}$Pr), —SiHEt($^{iso}$Pr), —SiH($^{n}$Pr)$_2$, —SiH($^{n}$Pr)($^{iso}$Pr) or —SiH($^{iso}$Pr)$_2$ but may not be limited thereto. In an embodiment of the present disclosure, —$SiR^3R^4R^5$ may be —$SiHMe_2$.

In an embodiment of the present disclosure, the silicon precursor compound, represented by the following Chemical Formula 2:

$R^1R^2N$—$SiH_2$—$N(SiR^3R^4R^5)_2$; [Chemical Formula 2]

wherein, in the above Chemical Formula 2, each of $R^1$ and $R^2$ independently includes a linear or branched $C_1$-$C_4$ alkyl group; and each of $R^3$, $R^4$ and $R^5$ independently includes hydrogen, a linear or branched $C_1$-$C_4$ alkyl group or a linear or branched alkenyl group, provided that $R^3$, $R^4$ and $R^5$ are not hydrogen at the same time.

In an embodiment of the present disclosure, each of $R^3$, $R^4$ and $R^5$ may be independently hydrogen, methyl group, ethyl group, n-propyl group, iso-propyl group, n-butyl group, iso-butyl group, sec-butyl group or tert-butyl group, but may not be limited thereto.

In an embodiment of the present disclosure, —$SiR^3R^4R^5$ includes —$SiHMe_2$, —SiHMeEt, —SiHMe($^{n}$Pr), —SiHMe($^{iso}$Pr), —$SiHEt_2$, —SiHEt($^{n}$Pr), —SiHEt($^{iso}$Pr), —SiH($^{n}$Pr)$_2$, —SiH($^{n}$Pr)($^{iso}$Pr) or —SiH($^{iso}$Pr)$_2$, but may not be limited thereto. In an embodiment of the present disclosure, —$SiR^3R^4R^5$ may be —$SiHMe_2$.

In an embodiment of the present disclosure, the silicon-containing film-forming precursor composition may include at least one selected from the following compounds:

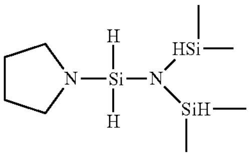
,

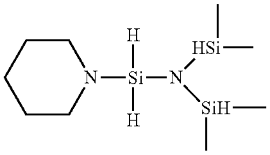
,

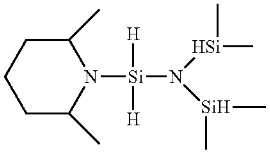
,

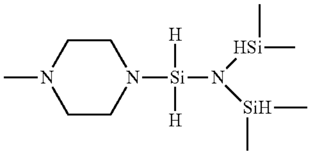
,

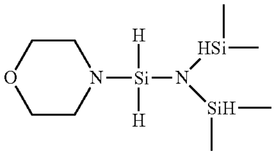
,

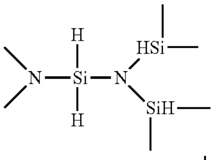
, and

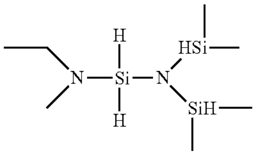
.

In an embodiment of the present disclosure, the film includes at least one selected from a silicon-containing oxide film or thin film, a silicon-containing nitride film or thin film, a silicon-containing carbide film or thin film, a silicon-containing oxynitride film or thin film, and a silicon containing carbonitride film or thin film, but may not be limited thereto. In an embodiment of the present disclosure, the film may be a silicon oxide film. In particular, in an embodiment of the present disclosure, when a silicon-containing film is formed using a film-forming precursor composition including the silicon precursor compound represented by the above Chemical Formula 2, a silicon oxide film may be formed.

In an embodiment of the present disclosure, the film-forming precursor composition may further include at least one nitrogen source(s) selected from ammonia, nitrogen, hydrazine and dimethyl hydrazine, but may not be limited thereto.

In an embodiment of the present disclosure, the film-forming precursor composition may further include at least one oxygen source(s) selected from water vapor, oxygen and ozone, but may not be limited thereto.

A fourth aspect of the present disclosure provides a method of forming a silicon-containing film, including forming a silicon-containing film using a film-forming precursor composition including a silicon precursor compound according to the first aspect.

Detailed descriptions of the fourth aspect of the present disclosure, which overlap with those of the first aspect to the third aspect of the present disclosure, are omitted hereinafter, but the descriptions of the first aspect to the third aspect of the present disclosure may be identically applied to the fourth aspect of the present disclosure, even though they are omitted hereinafter.

In an embodiment of the present disclosure, the silicon precursor compound may be represented by the following Chemical Formula I:

$R^1R^2N—SiH_2—N(SiR^3R^4R^5)_2$; [Chemical Formula I]

wherein, in the above Chemical Formula I, each of $R^1$ and $R^2$ independently includes a linear or branched $C_1$-$C_4$ alkyl group or a substituted or unsubstituted $C_4$-$C_8$ cyclic alkyl group linked to each other, if $R^1$ and $R^2$ are cyclic alkyl groups, $—NR^1R^2$ includes a cyclic amino group having at least one nitrogen atom; and each of $R^3$, $R^4$ and $R^5$ independently includes hydrogen, a linear or branched $C_1$-$C_4$ alkyl group or a linear or branched alkenyl group, provided that $R^3$, $R^4$ and $R^5$ are not hydrogen at the same time.

In an embodiment of the present disclosure, each of $R^1$ and $R^2$ may independently include methyl group, ethyl group, n-propyl group, iso-propyl group, n-butyl group, iso-butyl group, sec-butyl group, tert-butyl group, or a substituted or unsubstituted $C_4$-$C_8$ cyclic alkyl group linked to each other, but may not be limited thereto.

In an embodiment of the present disclosure, $—NR^1R^2$ may include dimethylamino group ($Me_2N—$), ethylmethylamino group (EtMeN—), diethylamino group ($Et_2N—$), pyrrolidine group, piperidine group, 2,6-dimethylpiperidine group, 4-methylpiperazine group, or morpholine group, but may not be limited thereto.

In an embodiment of the present disclosure, each of $R^3$, $R^4$ and $R^5$ may be independently hydrogen, methyl group, ethyl group, n-propyl group, iso-propyl group, n-butyl group, iso-butyl group, sec-butyl group or tert-butyl group, but may not be limited thereto.

In an embodiment of the present disclosure, $—SiR^3R^4R^5$ includes $—SiHMe_2$, —SiHMeEt, $—SiHMe(^{n}Pr)$, $—SiHMe(^{iso}Pr)$, $—SiHEt_2$, $—SiHEt(^{n}Pr)$, $—SiHEt(^{iso}Pr)$, $—SiH(^{n}Pr)_2$, $—SiH(^{n}Pr)(^{iso}Pr)$ or $—SiH(^{iso}Pr)_2$ but may not be limited thereto. In an embodiment of the present disclosure, $—SiR^3R^4R^5$ may be $—SiHMe_2$.

In an embodiment of the present disclosure, a silicon precursor compound, represented by the following Chemical Formula 1:

$R^1R^2N—SiH_2—N(SiR^3R^4R^5)_2$; [Chemical Formula 1]

wherein, in the above Chemical Formula 1, each of $R^1$ and $R^2$ is a substituted or unsubstituted $C_4$-$C_8$ cyclic alkyl group linked to each other, and $—NR^1R^2$ includes a cyclic amino group having at least one nitrogen atom; and each of $R^3$, $R^4$ and $R^5$ independently includes hydrogen, a linear or branched $C_1$-$C_4$ alkyl group or a linear or branched alkenyl group, provided that $R^3$, $R^4$ and $R^5$ are not hydrogen at the same time.

In an embodiment of the present disclosure, $—NR^1R^2$ includes pyrrolidine group, piperidine group, 2,6-dimethylpiperidine group, 4-methylpiperazine group or morpholine group.

In an embodiment of the present disclosure, each of $R^3$, $R^4$ and $R^5$ may be independently hydrogen, methyl group, ethyl group, n-propyl group, iso-propyl group, n-butyl group, iso-butyl group, sec-butyl group or tert-butyl group, but may not be limited thereto.

In an embodiment of the present disclosure, $—SiR^3R^4R^5$ includes $—SiHMe_2$, —SiHMeEt, $—SiHMe(^{n}Pr)$, $—SiHMe(^{iso}Pr)$, $—SiHEt_2$, $—SiHEt(^{n}Pr)$, $—SiHEt(^{iso}Pr)$, $—SiH(^{n}Pr)_2$, $—SiH(^{n}Pr)(^{iso}Pr)$ or $—SiH(^{iso}Pr)_2$, but may not be limited thereto. In an embodiment of the present disclosure, $—SiR^3R^4R^5$ may be $—SiHMe_2$.

In an embodiment of the present disclosure, the silicon precursor compound, represented by the following Chemical Formula 2:

$R^1R^2N—SiH_2—N(SiR^3R^4R^5)_2$; [Chemical Formula 2]

wherein, in the above Chemical Formula 2, each of $R^1$ and $R^2$ independently includes a linear or branched $C_1$-$C_4$ alkyl group; and each of $R^3$, $R^4$ and $R^5$ independently includes hydrogen, a linear or branched $C_1$-$C_4$ alkyl group or a linear or branched alkenyl group, provided that $R^3$, $R^4$ and $R^5$ are not hydrogen at the same time.

In an embodiment of the present disclosure, each of $R^3$, $R^4$ and $R^5$ may be independently hydrogen, methyl group, ethyl group, n-propyl group, iso-propyl group, n-butyl group, iso-butyl group, sec-butyl group or tert-butyl group, but may not be limited thereto.

In an embodiment of the present disclosure, $—SiR^3R^4R^5$ includes $—SiHMe_2$, —SiHMeEt, $—SiHMe(^{n}Pr)$, $—SiHMe(^{iso}Pr)$, $—SiHEt_2$, $—SiHEt(^{n}Pr)$, $—SiHEt(^{iso}Pr)$, $—SiH(^{n}Pr)_2$, $—SiH(^{n}Pr)(^{iso}Pr)$ or $—SiH(^{iso}Pr)_2$, but may not be limited thereto. In an embodiment of the present disclosure, $—SiR^3R^4R^5$ may be $—SiHMe_2$.

In an embodiment of the present disclosure, the silicon precursor compound included in the silicon-containing film-forming precursor composition may include at least one selected from the following compounds:

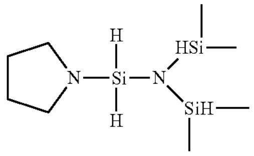

,

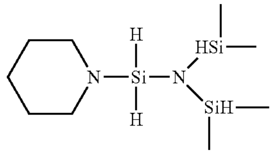

,

-continued

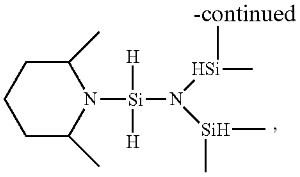

,

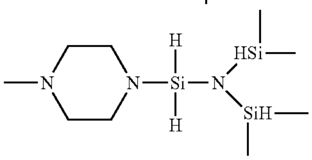

,

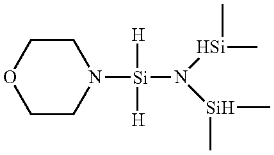

,

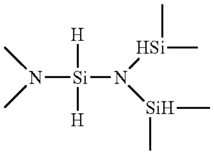

, and

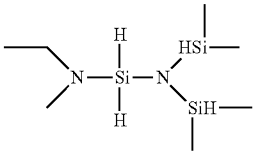

.

In an embodiment of the present disclosure, the film may include at least one selected from a silicon-containing oxide film or thin film, a silicon-containing nitride film or thin film, a silicon-containing carbide film or thin film, a silicon-containing oxynitride film or thin film, and a silicon containing carbonitride film or thin film, but may not be limited thereto. In an embodiment of the present disclosure, the silicon-containing film may be a silicon oxide film. In particular, in an embodiment of the present disclosure, when a silicon-containing film is formed using a film-forming precursor composition including the silicon precursor compound represented by the above Chemical Formula 2, a silicon oxide film may be formed.

In the embodiments of the present disclosure, according to a method of forming the silicon-containing film, it is possible to achieve film growth per gas supply cycle (film growth rate, GPC) of about 1.8 Å/cycle or more. For example, according to the method of forming the silicon-containing film, it is possible to achieve a film growth rate of about 1.8 Å/cycle or more, about 1.9 Å/cycle or more or about 2 Å/cycle or more.

In the embodiments described herein, as for the silicon-containing oxide film or thin film, the silicon-containing nitride film or thin film and/or the silicon-containing carbide film or thin film, the silicon-containing oxide thin film has been used for a dielectric film, a gate insulating film, a tunneling oxide film, a spacer oxide film, ILD & IMD and/or a passivation oxide film, and the silicon-containing nitride thin film has been used for a diffusion mask, a gate spacer, a gate dielectric film, an etch stopper, a stressor and/or passivation and can be variously applied depending on the purpose of application. However, the present disclosure may not be limited thereto.

In an embodiment of the present disclosure, the silicon-containing film may be deposited by chemical vapor deposition or atomic layer deposition, but may not be limited thereto. The silicon-containing film may be deposited by metal organic chemical vapor deposition (MOCVD) or atomic layer deposition (ALD), but may not be limited thereto. Further, the chemical vapor deposition or the atomic layer deposition may be performed using a deposition apparatus known in the art, deposition conditions and an additional reaction gas, but may not be limited thereto.

In an embodiment of the present disclosure, desirably, at least one of water vapor ($H_2O$), oxygen ($O_2$), oxygen plasma ($O_2$ Plasma), nitrogen oxides (NO, $N_2O$), nitrogen oxide plasma ($N_2O$ Plasma), oxygen nitride ($N_2O_2$), hydrogen peroxide ($H_2O_2$), and ozone ($O_3$) may be used as a reaction gas to form a silicon-containing oxide film or a complex metal silicon-containing oxide film (HfSiOx, ZrSiOx, TiSiOx, HfAlOx, ZrAlSiOx, TiAlSiOx, ZrHfSiOx, ZrHfAlSiOx, SiC, SiCO or SiON) when the film is deposited.

In an embodiment of the present disclosure, desirably, at least one of ammonia ($NH_3$), ammonia plasma ($NH_3$ Plasma), hydrazine ($N_2H_4$), and nitrogen plasma ($N_2$ Plasma) may be used as a reaction gas to form a silicon-containing nitride film (SiN) or a complex metal nitride film (HfSiNx, ZrSiNx, TiSiNx, AlSiNx, HfAlSiNx, ZrAlSiNx, TiAlSiNx, HfZrAlSiNx, HfZrTiSiNx, TiAlSiNx, SiCN, SiOCN or SiBN) when the film is deposited.

In an embodiment of the present disclosure, the silicon-containing film may be formed in a temperature range of about 100° C. to about 300° C., but may not be limited thereto. For example, the silicon-containing film may be formed in a temperature range of about 100° C. to about 300° C., about 100° C. to about 250° C., about 100° C. to about 200° C., about 100° C. to about 150° C., about 125° C. to about 300° C., about 125° C. to about 250° C., about 125° C. to about 200° C., about 125° C. to about 150° C., about 150° C. to about 300° C., about 150° C. to about 250° C., about 150° C. to about 200° C., about 200° C. to about 300° C., about 200° C. to about 250° C., or about 250° C. to about 300° C., but may not be limited thereto. In an embodiment of the present disclosure, the silicon-containing film may be formed in a temperature range of about 100° C. to about 300° C., or about 100° C. to about 250° C.

In the embodiments of the present disclosure, the thickness of the silicon-containing film may be about 1 nm to about 500 nm and can be variously applied depending on the purpose of application, but may not be limited thereto. For example, the thickness of the silicon-containing film may be about 1 nm to about 500 nm, about 1 nm to about 400 nm, about 1 nm to about 300 nm, about 1 nm to about 200 nm, about 1 nm to about 100 nm, about 1 nm to about 50 nm, about 1 nm to about 40 nm, about 1 nm to about 30 nm, about 1 nm to about 20 nm, about 1 nm to about 10 nm, about 10 nm to about 500 nm, about 10 nm to about 400 nm, about 10 nm to about 300 nm, about 10 nm to about 200 nm, about 10 nm to about 100 nm, about 10 nm to about 50 nm, about 10 nm to about 40 nm, about 10 nm to about 30 nm, about 10 nm to about 20 nm, about 20 nm to about 500 nm, about 20 nm to about 400 nm, about 20 nm to about 300 nm, about 20 nm to about 200 nm, about 20 nm to about 100 nm, about 20 nm to about 50 nm, about 20 nm to about 40 nm, about 20 nm to about 30 nm, about 30 nm to about 500 nm, about 30 nm to about 400 nm, about 30 nm to about 300 nm, about 30 nm to about 200 nm, about 30 nm to about 100 nm, about 30 nm to about 50 nm, about 30 nm to about 40 nm, about 40 nm to about 500 nm, about 40 nm to about 400 nm, about 40 nm to about 300 nm, about 40 nm to about 200 nm, about 40 nm to about 100 nm, about 40 nm to about 50 nm, about 50 nm to about 500 nm, about 50 nm to about 400 nm, about 50 nm to about 300 nm, about 50 nm to about 200 nm, about 50 nm to about 100 nm, about 100 nm to about 500 nm, about 100 nm to about 400 nm, about 100 nm to about 300 nm, about 100 nm to about 200 nm, about 200 nm to about 500 nm, about 200 nm to about 400 nm, about 200 nm to about 300 nm, about 300 nm to about 500 nm, about 300 nm to about 400 nm, or about 400 nm to about 500 nm, but may not be limited thereto.

In an embodiment of the present disclosure, the silicon-containing film may be formed on at least one substrate selected from typical silicon semiconductor wafers, compound semiconductor wafers and plastic substrates (PI, PET, PES, and PEN), but may not be limited thereto. Further, a substrate including holes or grooves may be used, or a porous substrate having a large surface area may be used, but may not be limited thereto. Also, the silicon-containing film may be simultaneously or sequentially formed on all or part of a substrate in which two or more different substrates are contacted or connected with each other, but may not be limited thereto.

In an embodiment of the present disclosure, the silicon-containing film may be formed on a substrate including at least one trench(es) having an aspect ratio of about 1 or more and a width of about 1 μm or less, but may not be limited thereto. In the embodiments of the present disclosure, the silicon-containing film may be formed on a substrate including trench(es) having an aspect ratio of about 1 to about 80 and a width of about 1 nm to about 1 μm, but may not be limited thereto. For example, the aspect ratio may be about 1 or more, about 5 or more, about 10 or more, about 20 or more, about 30 or more, about 40 or more, about 50 or more, about 60 or more, about 70 or more, or about 1 to about 80, about 1 to about 70, about 1 to about 60, about 1 to about 50, about 1 to about 40, about 1 to about 30, about 1 to about 20, about 1 to about 10, about 10 to about 80, about 10 to about 70, about 10 to about 60, about 10 to about 50, about 10 to about 40, about 10 to about 30, about 10 to about 20, about 20 to about 80, about 20 to about 70, about 20 to about 60, about 20 to about 50, about 20 to about 40, about 20 to about 30, about 30 to about 80, about 30 to about 70, about 30 to about 60, about 30 to about 50, about 30 to about 40, about 40 to about 80, about 40 to about 70, about 40 to about 60, about 40 to about 50, about 50 to about 80, about 50 to about 70, about 50 to about 60, about 60 to about 80, about 60 to about 70, or about 70 to about 80, but may not be limited thereto. Also, For example, the width may be about 1 nm to about 1 μm, about 1 nm to about 900 nm, about 1 nm to about 800 nm, about 1 nm to about 700 nm, about 1 nm to about 600 nm, about 1 nm to about 500 nm, about 1 nm to about 400 nm, about 1 nm to about 300 nm, about 1 nm to about 200 nm, about 1 nm to about 100 nm, about 1 nm to about 90 nm, about 1 nm to about 80 nm, about 1 nm to about 70 nm, about 1 nm to about 60 nm, about 1 to about 50 nm, about 1 nm to about 40 nm, about 1 nm to about 30 nm, about 1 nm to about 20 nm, about 1 nm to about 10 nm, about 10 nm to about 1 μm, about 10 nm to about 900 nm, about 10 nm to about 800 nm, about 10 nm to about 700 nm, about 10 nm to about 600 nm, about 10 nm to about 500 nm, about 10 nm to about 400 nm, about 10 nm to about 300 nm, about 10 nm to about 200 nm, about 10 nm to about 100 nm, about 10 nm to about 90 nm, about 10 nm to about 80 nm, about 10 nm to about 70 nm, about 10 nm to about 60 nm, about 10 to about 50 nm, about 10 nm to about 40 nm, about 10 nm to about 30 nm, about 10 nm to about 20 nm, about 20 nm to about 1 μm, about 20 nm to about 900 nm, about 20 nm to about 800 nm, about 20 nm to about 700 nm, about 20 nm to about 600 nm, about 20 nm to about 500 nm, about 20 nm to about 400 nm, about 20 nm to about 300 nm, about 20 nm to about 200 nm, about 20 nm to about 100 nm, about 20 nm to about 90 nm, about 20 nm to about 80 nm, about 20 nm to about 70 nm, about 20 nm to about 60 nm, about 20 to about 50 nm, about 20 nm to about 40 nm, about 20 nm to about 30 nm, about 30 nm to about 1 μm, about 30 nm to about 900 nm, about 30 nm to about 800 nm, about 30 nm to about 700 nm, about 30 nm to about 600 nm, about 30 nm to about 500 nm, about 30 nm to about 400 nm, about 30 nm to about 300 nm, about 30 nm to about 200 nm, about 30 nm to about 100 nm, about 30 nm to about 90 nm, about 30 nm to about 80 nm, about 30 nm to about 70 nm, about 30 nm to about 60 nm, about 30 to about 50 nm, about 30 nm to about 40 nm, about 40 nm to about 1 μm, about 40 nm to about 900 nm, about 40 nm to about 800 nm, about 40 nm to about 700 nm, about 40 nm to about 600 nm, about 40 nm to about 500 nm, about 40 nm to about 400 nm, about 40 nm to about 300 nm, about 40 nm to about 200 nm, about 40 nm to about 100 nm, about 40 nm to about 90 nm, about 40 nm to about 80 nm, about 40 nm to about 70 nm, about 40 nm to about 60 nm, about 40 to about 50 nm, about 50 nm to about 1 μm, about 50 nm to about 900 nm, about 50 nm to about 800 nm, about 50 nm to about 700 nm, about 50 nm to about 600 nm, about 50 nm to about 500 nm, about 50 nm to about 400 nm, about 50 nm to about 300 nm, about 50 nm to about 200 nm, about 50 nm to about 100 nm, about 50 nm to about 90 nm, about 50 nm to about 80 nm, about 50 nm to about 70 nm, about 50 nm to about 60 nm, about 100 nm to about 1 μm, about 100 nm to about 900 nm, about 100 nm to about 800 nm, about 100 nm to about 700 nm, about 100 nm to about 600 nm, about 100 nm to about 500 nm, about 100 nm to about 400 nm, about 100 nm to about 300 nm, about 100 nm to about 200 nm, about 200 nm to about 1 μm, about 200 nm to about 900 nm, about 200 nm to about 800 nm, about 200 nm to about 700 nm, about 200 nm to about 600 nm, about 200 nm to about 500 nm, about 200 nm to about 400 nm, about 200 nm to about 300 nm, about 300 nm to about 1 μm, about 300 nm to about 900 nm, about 300 nm to about 800 nm, about 300 nm to about 700 nm, about 300 nm to about 600 nm, about 300 nm to about 500 nm, about 300 nm to about 400 nm, about 400 nm to about 1 μm, about 400 nm to about 900 nm, about 400 nm to about 800 nm, about 400 nm to about 700 nm, about 400 nm to about 600 nm, about 400 nm to about 500 nm, about 500 nm to about 1 μm, about 500 nm to about 900 nm, about 500 nm to about 800 nm, about 500 nm to about 700 nm, about 500 nm to about 600 nm, about 600 nm to about 1 μm, about 600 nm to about 900 nm, about 600 nm to about 800 nm, about 600 nm to about 700 nm, about 700 nm to about 1 μm, about 700 nm to about 900 nm, about 700 nm to about 800 nm, about 800 nm to about 1 μm, about 800 nm to about 900 nm, or about 900 nm to about 1 μm, but may not be limited thereto.

In an embodiment of the present disclosure, the method of forming a silicon-containing film includes forming a silicon-containing oxide film or thin film or nitride film or thin film on a substrate located inside a deposition chamber by supplying a precursor composition for forming a silicon-containing oxide thin film or nitride thin film in the form of a gas onto the substrate, but may not be limited thereto. The method of forming a film may be performed using a method and an apparatus known in the art, or may be performed using at least one additional reaction gas if necessary.

In the embodiments of the present disclosure, the silicon precursor compound of the present disclosure included in the precursor composition for forming a film can be used as a precursor for atomic layer deposition or chemical vapor deposition due to its high vapor pressure, low density, and high thermal stability, and, thus, a silicon-containing film can be formed. In particular, the silicon precursor compound is highly effective in uniformly forming a silicon-containing oxide or nitride thin film having a thickness of from several nm to several μm, or from about 1 nm to about 500 nm even on a substrate having a pattern (groove) on the surface, a porous substrate, or a plastic substrate in a wide temperature range of from about 100° C. to about 300° C.

In an embodiment of the present disclosure, in the method of forming a silicon-containing film, desirably, a substrate is accommodated inside a reaction chamber and the silicon precursor compound is transferred onto the substrate using a carrier gas or a dilution gas to form a silicon-containing oxide thin film or nitride thin film in a wide deposition temperature range of from about 100° C. to about 300° C. Here, being capable of forming the silicon-containing film in the wide deposition temperature range has great potential for application in various fields by widely expanding a range of process temperatures applicable to memory devices, logic devices and display devices. Further, since each of a silicon-containing oxide film, a silicon-containing nitride film, or a silicon-containing carbide film has different film properties from each other, there is a need for a silicon precursor compound usable in a wide temperature range and deposition. Therefore, it is desirable that the film should be deposited in a wide deposition temperature range of from about 100° C. to about 300° C. However, the present disclosure may not be limited thereto.

In an embodiment of the present disclosure, in the method of forming a silicon-containing film, desirably, at least one gas mixture selected from argon (Ar), nitrogen ($N_2$), helium (He) and hydrogen ($H_2$) may be used as the carrier gas or the dilution gas. Also, the silicon precursor compound may be transferred onto the substrate by various supply methods including: a bubbling method of forcibly vaporizing the precursor using a carrier gas; a liquid delivery system (LDS) method of supplying the precursor in a liquid state at room temperature and vaporizing the precursor through a vaporizer; and a vapor flow controller (VFC) method of directly supplying the precursor using a vapor pressure of the precursor. Most desirably, if the vapor pressure of the silicon precursor compound is high, the VFC method may be used. If the precursor is supplied in a liquid state, vaporized in a vaporizer, and supplied into the chamber, the LDS method may be used. If the vapor pressure of the precursor is low, the VFC method of heating a container and vaporizing the precursor may be used. Most desirably, the silicon precursor compound may be placed in a bubbler container, an LDS container or a VFC container and transferred and supplied into the chamber by means of a high vapor pressure by bubbling, LDS or VFC using a carrier gas in a pressure range of from about 0.1 torr to about 10 torr and a temperature range of from room temperature to about 100° C. However, the present disclosure may not be limited thereto.

In an embodiment of the present disclosure, an argon (Ar) or nitrogen ($N_2$) gas may be used as a carrier gas or heat energy or plasma may be used to vaporize the silicon precursor compound, and more desirably, a bias may be applied onto the substrate. However, the present disclosure may not be limited thereto.

In an embodiment of the present disclosure, the silicon-containing oxide film can be grown much faster by the ALD method, particularly, the plasma ALD method using an oxygen ($O_2$) gas with the film-forming precursor composition including the silicon compound.

MODE FOR CARRYING OUT THE INVENTION

Hereinafter, the present disclosure will be explained in more detail with reference to Examples. However, the following Examples are illustrative only for better understanding of the present disclosure but do not limit the present disclosure.

EXAMPLES

<Example 1> Preparation of pyrrolidinyl(tetramethyldisilyl)aminosilane: $[(CH_2CH_2CH_2CH_2N)SiH_2\{N(SiHMe_2)_2\}]$ In a 5-L round-bottom flask, 358.49 g (2.5 M, 1.287 mol) of n-butyllithium hexane solution (n-BuLi in n-hex.) was mixed with 3,000 mL of anhydrous hexane. After 171.62 g (1.287 mol) of 1,1,3,3-tetramethyldisilazane was added into the resultant solution at about −20° C., the temperature was slowly increased to room temperature with stirring and then, the reaction mixture was stirred for 4 hours. After 130 g (1.287 mol) of dichlorosilane was added into the resultant lithium(tetramethylsilylamine) salt solution at from −30° C. to −20° C. for 30 minutes, the temperature was slowly increased with stirring and then, the reaction mixture was stirred for 17 hours. After completion of the reaction, the LiCl salt produced from the reaction was removed through a filtration process, and the solvent and volatile by-products were removed through vacuum distillation to obtain 168 g of a colorless liquid compound (tetramethyldisilyl)aminochlorosilane $[ClSiH_2\{N(SiHMe_2)_2\}]$ (yield: 66%).

In a 1-L round-bottom flask, 77.414 g (2.5 M, 0.278 mol) of n-butyllithium hexane solution (n-BuLi in n-hex.) was mixed with 500 mL of anhydrous hexane. After 19.77 g (0.278 mol) of pyrrolidine was added into the resultant solution at about −20° C., the temperature was slowly increased to room temperature with stirring and then, the reaction mixture was stirred for 4 hours. After 50 g (0.252 mol) of the obtained (tetramethyldisilyl)aminochlorosilane $[ClSiH_2\{N(SiHMe_2)_2\}]$ was added into the resultant lithium pyrrolidine salt solution at from −30° C. to −20° C. for 30 minutes, the temperature was slowly increased with stirring and then, the reaction mixture was stirred for 17 hours. After completion of the reaction, the salt produced from the reaction was removed through a filtration process, and the solvent and volatile by-products were removed through vacuum distillation to obtain 38 g of a colorless liquid compound pyrrolidinyl(tetramethyldisilyl)aminosilane $[(CH_2CH_2CH_2CH_2N)SiH_2\{N(SiHMe_2)_2\}]$ represented by the following Chemical Formula 3 (yield: 65%).

b.p: 32° C. at 0.3 torr (210.3° C. at 760 mmHg)

$^1$H-NMR ($C_6D_6$): δ 0.265, 0.273 (N—Si—$CH_3$, d, 12H), δ 1.502 (N—$CH_2$—$CH_2$, m, 4H), δ 2.973 (N—$CH_2$, m, 4H), δ 4.827 ($H_3C$—Si—H, m, 2H), δ 4.981 (Si—H, s, 2H)

[Chemical Formula 3]

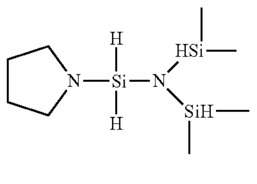

<Example 2> Preparation of piperidinyl(tetramethyldisilyl)aminosilane: $[(CH_2CH_2CH_2CH_2CH_2N)SiH_2\{N(SiHMe_2)_2\}]$ In a 1-L round-bottom flask, 77.414 g (2.5 M, 0.278 mol) of n-butyllithium hexane solution (n-BuLi in n-hex.) was mixed with 500 mL of anhydrous hexane. After 23.66 g (0.278 mol) of piperidine was added into the resultant solution at about −20° C., the temperature was slowly increased to room temperature with stirring and then, the reaction mixture was stirred for 4 hours. After 50 g (0.252 mol) of (tetramethyldisilyl)aminochlorosilane [$ClSiH_2\{N(SiHMe_2)_2\}$] synthesized as in Example 1 was added into the resultant lithium piperidine salt solution at from −30° C. to −20° C. for 30 minutes, the temperature was slowly increased with stirring and then, the reaction mixture was stirred for 17 hours. After completion of the reaction, the LiCl salt produced from the reaction was removed through a filtration process, and the solvent and volatile by-products were removed through vacuum distillation to obtain 47 g of a colorless liquid compound piperidinyl (tetramethyldisilyl) aminosilane [$(CH_2CH_2CH_2CH_2CH_2N)SiH_2\{N(SiHMe_2)_2\}$] represented by the following Chemical Formula 4 (yield: 75%).

b.p: 36° C. at 0.3 torr (221.2° C. at 760 mmHg)

$^1$H-NMR ($C_6D_6$): δ 0.264, 0.272 (N—Si—$CH_3$, d, 12H), δ 1.335 (N—$CH_2$—$CH_2$, m, 4H), δ 1.424 (N—$CH_2$—$CH_2$—$CH_2$, m, 2H), δ 2.876 (N—$CH_2$, m, 4H), δ 4.819 ($H_3C$—Si—H, m, 2H), δ 4.867 (Si—H, s, 2H).

[Chemical Formula 4]

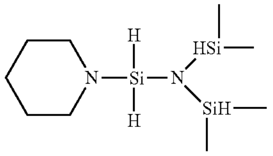

<Example 3> Preparation of 2,6-dimethylpiperidinyl(tetramethyldisilyl)aminosilane: [$\{CH(CH_3)CH_2CH_2CH_2CH(CH_3)N\}SiH_2\{N(SiHMe_2)_2\}$]

In a 1-L round-bottom flask, 77.414 g (2.5 M, 0.278 mol) of n-butyllithium hexane solution (n-BuLi in n-hex.) was mixed with 500 mL of anhydrous hexane. After 31.45 g (0.278 mol) of 2,6-dimethylpiperidine was added into the resultant solution at about −20° C., the temperature was slowly increased to room temperature with stirring and then, the reaction mixture was stirred for 4 hours. After 50 g (0.252 mol) of (tetramethyldisilyl)aminochlorosilane [$ClSiH_2\{N(SiHMe_2)_2\}$] synthesized as in Example 1 was added into the resultant lithium 2,6-dimethylpiperidine salt solution at from −30° C. to −20° C. for 30 minutes, the temperature was slowly increased with stirring and then, the reaction mixture was stirred for 17 hours. After completion of the reaction, the LiCl salt produced from the reaction was removed through a filtration process, and the solvent and volatile by-products were removed through vacuum distillation to obtain 46 g of a colorless liquid compound 2,6-dimethylpiperidinyl(tetramethyldisilyl)aminosilane represented by the following Chemical Formula 5 (yield: 66%).

b.p: 55° C. at 0.3 torr (244.5° C. at 760 mmHg)

$^1$H-NMR ($C_6D_6$): δ 0.282, 0.290 (N—Si—$CH_3$, d, 12H), δ 1.220, 1.238 (N—CH—$CH_3$, d, 6H), δ 1.292, 1.329 (N—CH—$CH_2$, m, 4H), δ 1.515 (N—CH—$CH_2$—$CH_2$, m, 2H), δ 3.365 (N—CH, m, 2H), δ 4.833 ($H_3C$—Si—H, m, 2H), δ 4.902 (Si—H, s, 2H)

[Chemical Formula 5]

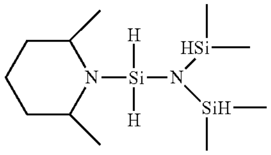

<Example 4> Preparation of 4-methylpiperazinyl (tetramethyldisilyl)aminosilane: [$\{CH_2CH_2N(CH_3)CH_2CH_2N\}SiH_2\{N(SiHMe_2)_2\}$]

In a 1-L round-bottom flask, 77.414 g (2.5 M, 0.278 mol) of n-butyllithium hexane solution (n-BuLi in n-hex.) was mixed with 500 mL of anhydrous hexane. After 27.84 g (0.278 mol) of 4-methylpiperazine was added into the resultant solution at about −20° C., the temperature was slowly increased to room temperature with stirring and then, the reaction mixture was stirred for 4 hours. After 50 g (0.252 mol) of (tetramethyldisilyl)aminochlorosilane [$ClSiH_2\{N(SiHMe_2)_2\}$] synthesized as in Example 1 was added into the resultant lithium 4-methylpiperazine salt solution at from −30° C. to −20° C. for 30 minutes, the temperature was slowly increased with stirring and then, the reaction mixture was stirred for 17 hours. After completion of the reaction, the salt produced from the reaction was removed through a filtration process, and the solvent and volatile by-products were removed through vacuum distillation to obtain 46 g of a colorless liquid compound 4-methylpiperazinyl(tetramethyldisilyl)aminosilane represented by the following Chemical Formula 6 (yield: 70%).

b.p: 45° C. at 0.3 torr (230.4° C. at 760 mmHg)

$^1$H-NMR ($C_6D_6$): δ 0.250, 0.259 (N—Si—$CH_3$, d, 12H), δ 2.092 (N—$CH_3$, s, 3H), δ 2.132 ($H_3C$—N—$CH_2$, m, 4H), δ 2.985 (Si—N—$CH_2$, t, 2H), δ 4.804 ($H_3C$—Si—H, m, 4H), δ 4.858 (Si—H, s, 2H)

[Chemical Formula 6]

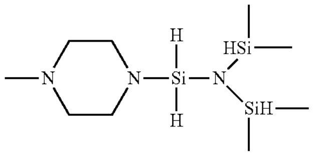

<Example 5> Preparation of morpholino(tetramethyldisilyl)aminosilane: [$(CH_2CH_2OCH_2CH_2N)SiH_2\{N(SiHMe_2)_2\}$]

In a 1-L round-bottom flask, 77.414 g (2.5 M, 0.278 mol) of n-butyllithium hexane solution (n-BuLi in n-hex.) was mixed with 500 mL of anhydrous hexane. After 24 g (0.278 mol) of morpholine was added into the resultant solution at about −20° C., the temperature was slowly increased to room temperature with stirring and then, the reaction mixture was stirred for 4 hours. After 50 g (0.252 mol) of (tetramethyldisilyl)aminochlorosilane [$ClSiH_2\{N(SiHMe_2)_2\}$] synthesized as in Example 1 was added into the resultant lithium morpholine salt solution at from −30° C. to −20° C. for 30 minutes, the temperature was slowly increased with stirring and then, the reaction mixture was stirred for 17 hours. After completion of the reaction, the salt produced from the reaction was removed through a filtration process, and the solvent and volatile by-products were removed through vacuum distillation to obtain 24 g of a colorless liquid compound morpholino(tetramethyldisilyl)aminosilane represented by the following Chemical Formula 7 (yield: 35%).

b.p: 45° C. at 0.3 torr (230.4° C. at 760 mmHg)

$^1$H-NMR ($C_6D_6$): δ 0.212, 0.221 (N—Si—$CH_3$, d, 12H), δ 2.779 (N—$CH_2$, t, 4H), δ 3.434 (O—$CH_2$, t, 4H), δ 4.754 ($H_3$C—Si—H, m, 2H), δ 4.767 (Si—H, s, 2H)

[Chemical Formula 7]

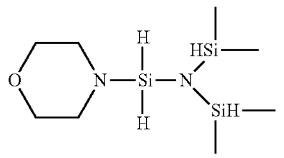

<Example 6> Preparation of $Me_2NSiH_2N(SiHMe_2)_2$(TMDMS)

$Me_2NSiH_2N(SiHMe_2)_2$(TMDMS) represented by the following chemical formula was prepared as in Example 1 except that dimethylamine was used instead of pyrrolidine.

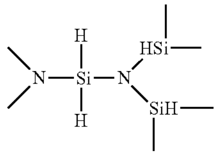

<Example 7> Preparation of $EtMeNSiH_2N(SiHMe_2)_2$(TMEMS)

$EtMeNSiH_2N(SiHMe_2)_2$(TMEMS) represented by the following chemical formula was prepared as in Example 1 except that ethylmethylamine was used instead of pyrrolidine.

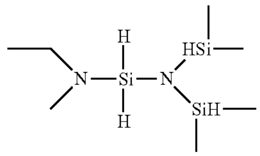

<Test Example 1> Structural Analysis of Silicon Precursor Compounds

Figure 1B:
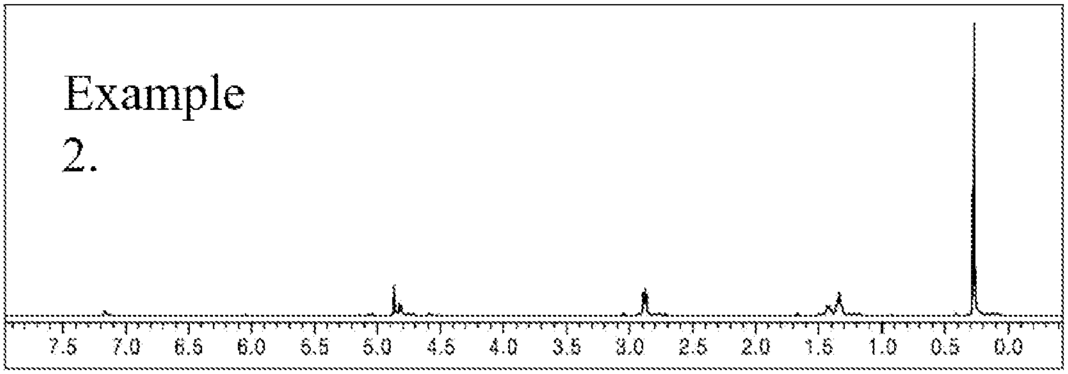
Figure 2:
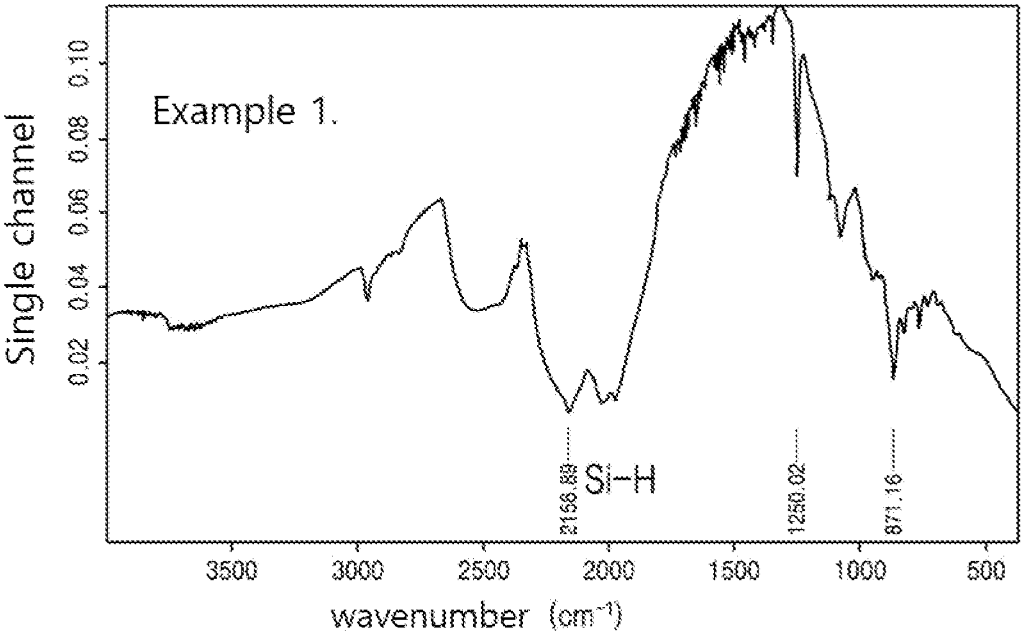
FIG. 2 shows FT-IR spectra of the silicon-containing compounds prepared according to Example 1 of the present disclosure.

A $^1$H-NMR analysis and an FT-IR analysis were conducted to analyze the structures of the silicon precursor compounds prepared according to Examples 1 and 2, and the results are shown in FIG. 1A, FIG. 1B and FIG. 2.

As can be seen from FIG. 1A, the silicon precursor compound prepared according to Example 1 was confirmed to show Si—H peaks at 4.827 ppm and 4.981 ppm as a result of $^1$H-NMR analysis. Also, as can be seen from FIG. 2, the silicon precursor compound was confirmed to show a strong peak of Si—H in the molecule at 2158 $cm^{-1}$ as a result of FT-IR analysis. The compound of Example 1 was confirmed from the results of $^1$H-NMR and FT-IR analyses, and it was confirmed from the structure of the material that the compound is an excellent precursor capable of forming silicon-containing oxide and nitride thin films in a wide temperature range.

Figure 3:
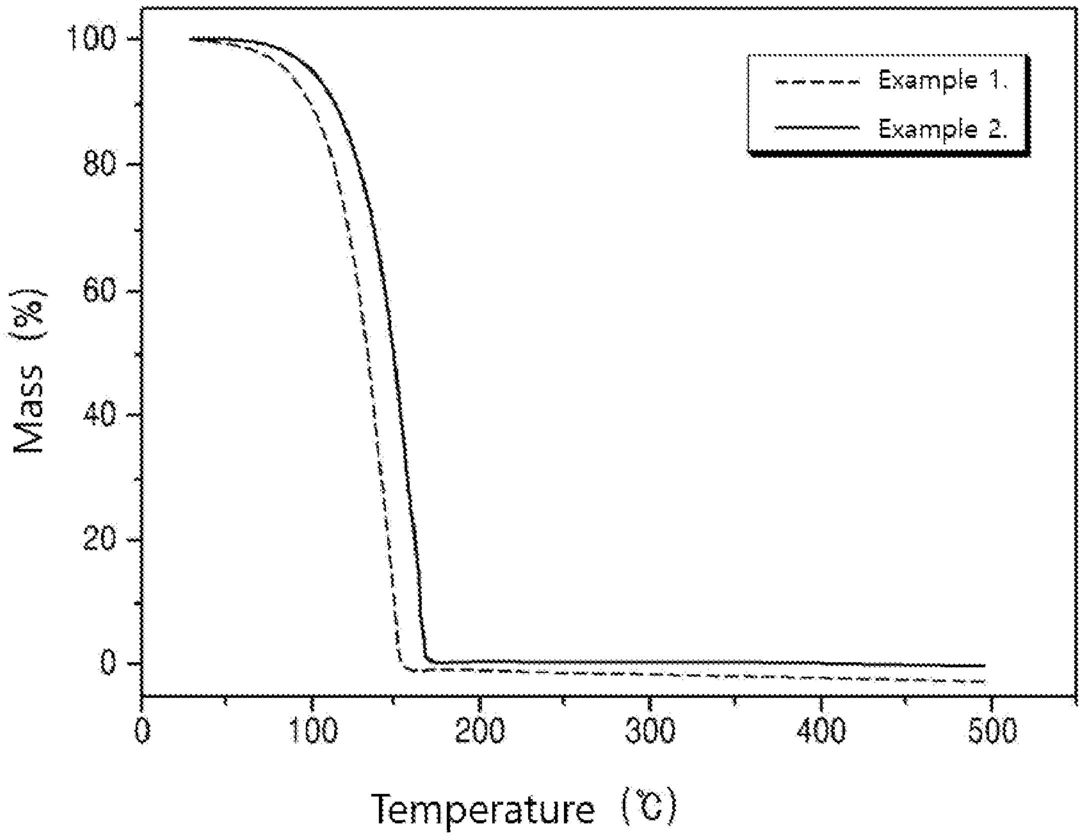
FIG. 3 shows a TGA graph of the silicone-containing compounds prepared according to Examples 1 and 2 of the present disclosure.

<Test Example 2> Analysis of Thermal Characteristics of Silicon Precursor Compounds A TG analysis was conducted to analyze the fundamental thermal characteristics of the silicon precursor compounds prepared according to Examples 1 and 2, and the results are shown in FIG. 3.

As can be seen from FIG. 3, all the silicon precursor compounds prepared according to Examples 1 and 2 were confirmed to show sufficient volatility to be applied to atomic layer deposition. Further, the silicon precursor compounds of the present disclosure exhibited various volatilities, and, thus, it was confirmed that they are excellent precursors capable of forming silicon-containing oxide and nitride thin films in a wide temperature range of 150° C. or less, from 150° C. to 500° C. and 500° C. or more.

<Example 8> Plasma Atomic Layer Deposition Using Silicon Compound of the Present Disclosure as Precursor Silicon oxide films were formed by plasma-enhanced ALD with the silicon precursor compounds prepared according to Examples 1 and 2 and TMDMS and TMEMS prepared according to Examples 6 and 7. $O_2$ plasma was generated by applying a RF power of 200 W when an oxygen $O_2$ gas was supplied in an ALD gas supply cycle. A silicon wafer piece was immersed for 10 minutes in a piranha solution in which sulfuric acid ($H_2SO_4$) and hydrogen peroxide ($H_2O_2$) were mixed at a ratio of 4:1 ratio and then taken out. Then, the silicon wafer piece was immersed for 2 minutes in a dilute HF aqueous solution to remove native oxide and then heated at a substrate temperature of from 125° C. to 300° C. The silicon precursor compounds were placed in respective containers made of stainless steel and then vaporized using an argon (Ar) gas having a flow rate of 200 sccm as a carrier gas for precursor compound while heating the silicon compound of Example 1 at a container temperature of 50° C. and the silicon compound of Example 2 at a container temperature of 60° C. TMDMS and TMEMS prepared according to Examples 6 and 7 were vaporized using an Ar gas having the same flow rate as a carrier gas while maintaining the temperatures of the stainless steel containers at room temperature. While maintaining the process pressure of an ALD reaction chamber at 1 torr, the ALD gas supply cycle composed of supply of a silicon compound gas for 3 sec, Ar purge for 10 sec, $O_2$ plasma for 3 sec and Ar purge for 10 sec was repeated 100 times. The thickness of the silicon oxide film thus formed was measured using an ellipsometer, and the silicon oxide film growth per ALD gas supply cycle depending on the temperature is shown in FIG. 4.

Figure 4:
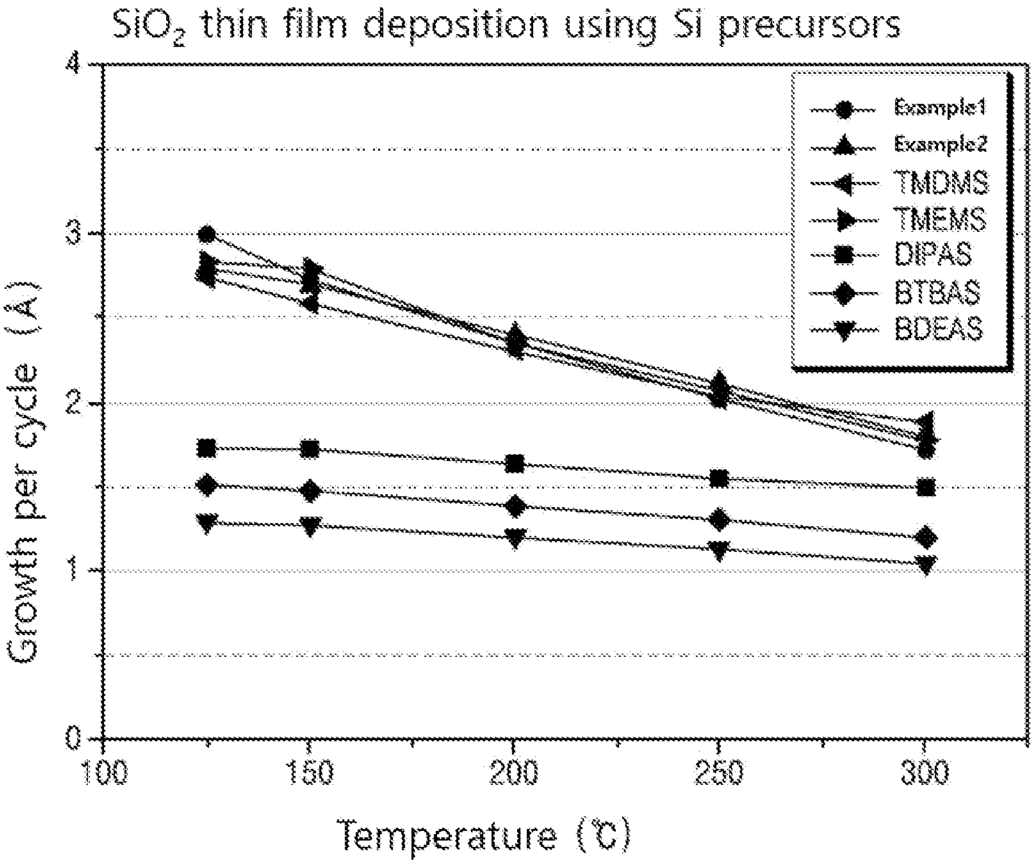
FIG. 4 is a graph showing the silicon oxide film growth per gas supply cycle with silicon compounds prepared according to Examples 1 and 2 of the present disclosure in a plasma ALD method using an oxygen ($O_2$) gas at a substrate temperature of 125° C. to 300° C. depending on the temperature.

Also, a silicon oxide film was formed by the same ALD method using plasma except that diisopropylaminosilane (DIPAS, $H_3SiN^iPr_2$), bis(diethylamino)silane [BDEAS, $H_2Si(NEt_2)_2$] and bis(t-butylamino)silane [BTBAS, $H_2Si(NH^tBu)_2$] conventionally known in the art as silicon precursor compounds for ALD were vaporized at room temperature, and the silicon oxide film growth per ALD gas supply cycle depending on the temperature is shown in FIG. 4.

It can be seen from FIG. 4 that the film growth per ALD gas supply cycle when using the silicon compound of the present disclosure as a precursor is significantly greater than when using the conventionally known silicon precursors diisopropyl aminosilane(DIPAS, $H_3SiN^iPr_2$), bis(diethylamino)silane[BDEAS, $H_2Si(NEt_2)_2$] and bis(t-butylamino) silane[BTBAS, $H_2Si(NH^tBu)_2$]. Referring to FIG. 4, it can be confirmed that GPC of 1.8 Å/cycle or more, 1.9 Å/cycle or more and 2 Å/cycle or more, which cannot be achieved when using the conventionally known DIPAS, BTBAS and BDEAS, is shown. If the film growth per ALD gas supply cycle is fast, an ALD process more semiconductors or display substrates per unit time. Therefore, it is possible to minimize the number of required ALD devices. Accordingly, the use of a silicon compound of the present disclosure can reduce manufacturing costs of semiconductors or display devices.

The above description of the present disclosure is provided for the purpose of illustration, and it would be understood by a person with ordinary skill in the art that various changes and modifications may be made without changing technical conception and essential features of the present disclosure. Thus, it is clear that the above-described examples are illustrative in all aspects and do not limit the present disclosure. For example, each component described to be of a single type can be implemented in a distributed manner. Likewise, components described to be distributed can be implemented in a combined manner.

The scope of the present disclosure is defined by the following claims rather than by the detailed description of the embodiment. It shall be understood that all modifications and embodiments conceived from the meaning and scope of the claims and their equivalents are included in the scope of the present disclosure.

We claim:

1. A silicon precursor compound, represented by the following Chemical Formula 1:

$R^1R^2N—SiH_2—N(SiR^3R^4R^5)_2$; [Chemical Formula 1]

wherein, in the above Chemical Formula 1,

—$NR^1R^2$ includes pyrrolidine group, piperidine group, 2,6-dimethylpiperidine group, 4-methylpiperazine group or morpholine group;

$R^3$ is hydrogen, methyl group, ethyl group, n-propyl group, iso-propyl group, n-butyl group, iso-butyl group, sec-butyl group, or tert-butyl group; and each of $R^4$ and $R^5$ is independently methyl group, ethyl group, n-propyl group, iso-propyl group, n-butyl group, iso-butyl group, sec-butyl group, or tert-butyl group.

2. The precursor compound of claim 1, wherein —$SiR^3R^4R^5$ includes —$SiHMe_2$, —SiHMeEt, —SiHMe($^{n}$Pr), —SiHMe($^{iso}$Pr), —$SiHEt_2$, —SiHEt($^{n}$Pr), —SiHEt($^{iso}$Pr), —SiH($^{n}$Pr)$_2$, —SiH($^{n}$Pr)($^{iso}$Pr) or —SiH($^{iso}$Pr)$_2$.

3. The precursor compound of claim 1, wherein the silicon precursor compound includes the following compounds:

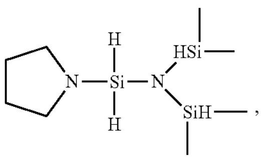

-continued

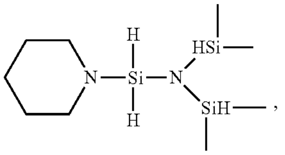

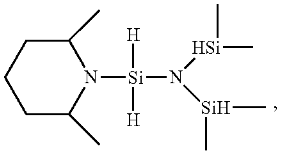

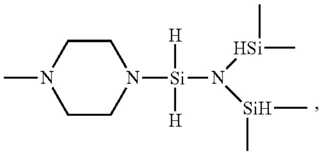

or

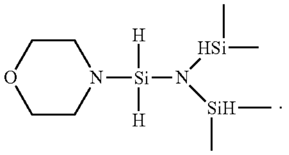

4. A silicon-containing film-forming precursor composition, comprising:

a silicon precursor compound according to claim 1.

5. The precursor composition of claim 4, wherein the silicon precursor compound includes at least one selected from the group consisting of:

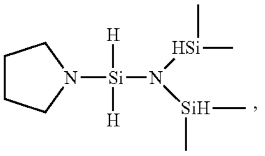

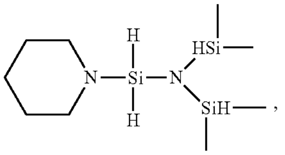

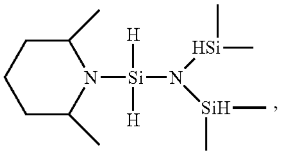

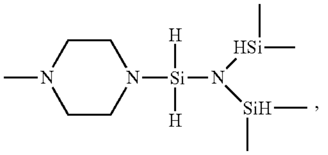

and

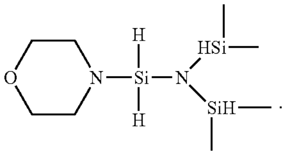

6. The precursor composition of claim 4, wherein the film includes at least one selected from the group consisting of a silicon-containing oxide film, a silicon-containing nitride film, and a silicon-containing carbide film.

7. The precursor composition of claim 4, further comprising: at least one nitrogen source(s) selected from the group consisting of ammonia, nitrogen, hydrazine, and dimethyl hydrazine.

8. The precursor composition of claim 4, further comprising: at least one oxygen source(s) selected from the group consisting of water vapor, oxygen, and ozone.

9. A method of forming a silicon-containing film, comprising: forming a silicon-containing film using a film-forming precursor composition including a silicon precursor compound represented by the following Chemical Formula 1:

$R^1R^2N—SiH_2—N(SiR^3R^4R^5)_2$; [Chemical Formula 1]

wherein, in the above Chemical Formula 1:

—$NR^1R^2$ includes pyrrolidine group, piperidine group, 2,6-dimethylpiperidine group, 4-methylpiperazine group, or morpholine group;

$R^3$ is hydrogen, methyl group, ethyl group, n-propyl group, iso-propyl group, n-butyl group, iso-butyl group, sec-butyl group, or tert-butyl group; and each of $R^4$ and $R^5$ is independently methyl group, ethyl group, n-propyl group, iso-propyl group, n-butyl group, iso-butyl group, sec-butyl group, or tert-butyl group.

10. The method of claim 9, wherein —$SiR^3R^4R^5$ includes —$SiHMe_2$, —SiHMeEt, —SiHMe($^n$Pr), —SiHMe($^{iso}$Pr), —$SiHEt_2$, —SiHEt($^n$Pr), —SiHEt($^{iso}$Pr), —$SiH(^nPr)_2$, —SiH($^n$Pr)($^{iso}$Pr) or —$SiH(^{iso}Pr)_2$.

11. The method of claim 9, wherein the silicon precursor compound included in the silicon-containing film-forming precursor composition includes at least one selected from the group consisting of:

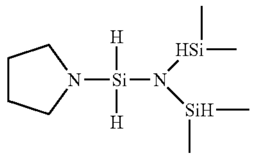

,

-continued

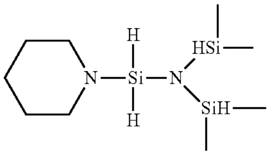

,

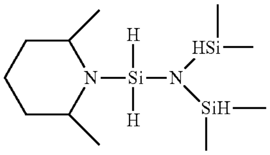

,

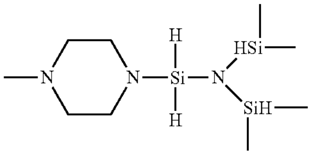

, and

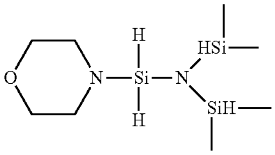

.

12. The method of claim 9, wherein the silicon-containing film includes at least one selected from the group consisting of a silicon-containing oxide film, a silicon-containing nitride film, and a silicon-containing carbide film.

13. The method of claim 9, wherein the silicon-containing film is deposited by chemical vapor deposition or atomic layer deposition.

14. The method of claim 9, wherein the silicon-containing film is formed in a temperature range of 100° C. to 300° C.

15. The method of claim 9, wherein a thickness of the silicon-containing film is 1 nm to 500 nm.

16. The method of claim 9, wherein the silicon-containing film is formed on a substrate including at least one trench(es) having an aspect ratio of 1 or more and a width of 1 μm or less.

* * * * *